United States Patent
Fornage et al.

(10) Patent No.: US 8,749,395 B2
(45) Date of Patent: Jun. 10, 2014

(54) METHOD AND APPARATUS FOR INDICATING A DISCONNECTION WITHIN A DISTRIBUTED GENERATOR

(75) Inventors: Martin Fornage, Petaluma, CA (US); Raghuveer R. Belur, Los Altos Hills, CA (US)

(73) Assignee: Enphase Energy, Inc., Petaluma, CA (US)

( * ) Notice: Subject to any disclaimer, the term of this patent is extended or adjusted under 35 U.S.C. 154(b) by 391 days.

(21) Appl. No.: 13/088,997

(22) Filed: Apr. 18, 2011

(65) Prior Publication Data

US 2011/0273302 A1 Nov. 10, 2011

Related U.S. Application Data

(60) Provisional application No. 61/342,573, filed on Apr. 16, 2010.

(51) Int. Cl.
G08B 21/00 (2006.01)
(52) U.S. Cl.
USPC .......... 340/635; 340/506; 340/584; 340/657; 340/664; 136/243; 136/252; 136/291; 323/906; 307/64; 307/66; 307/67
(58) Field of Classification Search
USPC ................ 340/506, 584, 635, 657, 660, 664; 136/243, 244, 252, 291, 293; 323/906; 307/64, 66, 117
See application file for complete search history.

(56) References Cited

U.S. PATENT DOCUMENTS

| 6,219,623 | B1 | 4/2001 | Wills |
| 6,429,546 | B1 | 8/2002 | Ropp et al. |
| 6,587,051 | B2 * | 7/2003 | Takehara et al. ............. 340/635 |
| 7,202,638 | B2 | 4/2007 | Ye et al. |
| 7,427,815 | B1 | 9/2008 | Ye et al. |
| 2005/0275979 | A1 | 12/2005 | Xu |
| 2009/0207543 | A1 * | 8/2009 | Boniface et al. ............. 361/86 |
| 2011/0260871 | A1 * | 10/2011 | Karkowski ................ 340/573.1 |

FOREIGN PATENT DOCUMENTS

WO WO 2009/026602 A1 3/2009

OTHER PUBLICATIONS

International Search Report and Written Opinion mailed Aug. 29, 2011 for PCT Application No. PCT/US2011/032862.
U.S. Appl. No. 12/931,081, filed Jan. 24, 2011, entitled: "Method and Apparatus for Interconnecting Distributed Power Sources", 26 pages.

* cited by examiner

*Primary Examiner* — George Bugg
*Assistant Examiner* — Sharmin Akhter
(74) *Attorney, Agent, or Firm* — Moser Taboada

(57) ABSTRACT

A method and apparatus for indicating a disconnection within a Distributed Generator (DG). In one embodiment, the apparatus comprises an alarm module electrically coupled to a conductive portion of a component within the DG, wherein the conductive portion is grounded via a ground rod system, and wherein the alarm module (i) is further coupled to a ground line, (ii) couples a monitoring current to the conductive portion, (iii) monitors flow of the monitoring current to determine a change in the flow, and (iv) generates, as a result of the change in the flow, a notification of the disconnection.

20 Claims, 3 Drawing Sheets

METHOD AND APPARATUS FOR INDICATING A DISCONNECTION WITHIN A DISTRIBUTED GENERATOR

CROSS-REFERENCE TO RELATED APPLICATIONS

This application claims benefit of U.S. provisional patent application Ser. No. 61/342,573, filed Apr. 16, 2010, which is herein incorporated in its entirety by reference.

BACKGROUND OF THE INVENTION

1. Field of the Invention

Embodiments of the present disclosure relate generally to Distributed Generator (DG) systems and, more particularly, to a method and apparatus for detecting a disconnected component within a DG.

2. Description of the Related Art

Use of distributed generators (DGs) to produce energy from renewable resources is steadily gaining commercial acceptance due to the rapid depletion of existing fossil fuels and the increasing costs of current methods of generating power. One such type of DG may be a solar power system comprising one or more arrays of photovoltaic (PV) modules that convert solar energy received from the sun into a direct current (DC). One or more inverters then convert the DC current from the PV modules into an alternating current (AC). The AC power generated may then be used to run appliances at a home or business, or may be sold to the commercial power company.

Although deployment of solar power systems is becoming increasingly widespread and therefore more competitively priced, solar power systems still entail substantial costs, for example, the cost of purchasing and installing individual PV modules. The out-of-doors and sometimes isolated location of the solar power systems, along with the modularity of the solar power system components, provides an opportunity for the PV modules to be stolen and illegally re-sold.

Therefore, there is a need in the art for determining when a component within a DG becomes disconnected.

SUMMARY OF THE INVENTION

Embodiments of the present invention generally relate to a method and apparatus for indicating a disconnection within a Distributed Generator (DG). In one embodiment, the apparatus comprises an alarm module electrically coupled to a conductive portion of a component within the DG, wherein the conductive portion is grounded via a ground rod system, and wherein the alarm module (i) is further coupled to a ground line, (ii) couples a monitoring current to the conductive portion, (iii) monitors flow of the monitoring current to determine a change in the flow, and (iv) generates, as a result of the change in the flow, a notification of the disconnection.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
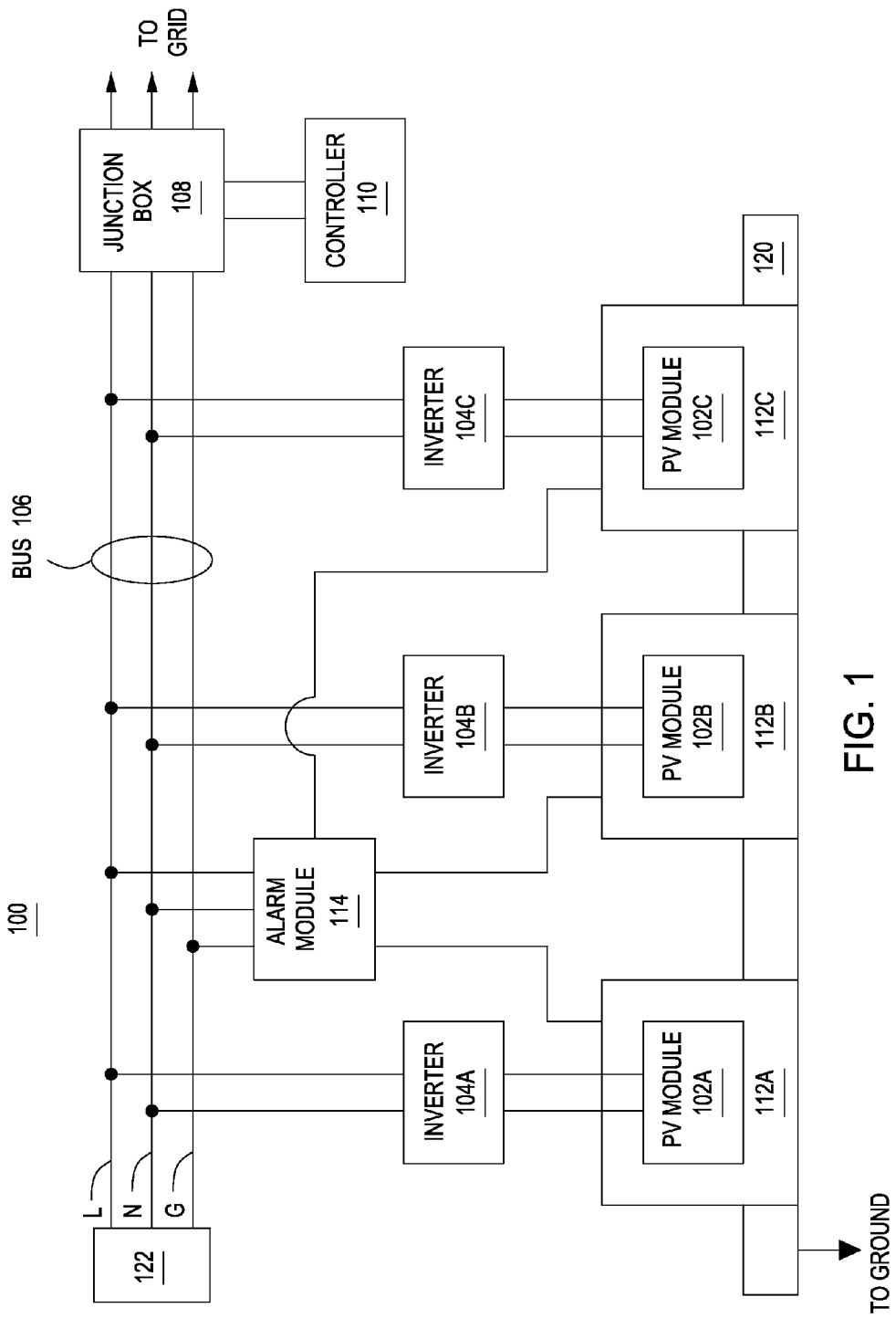
FIG. 1 is a block diagram of a Distributed Generator (DG) in accordance with one or more embodiments of the present invention.

FIG. 1 is a block diagram of a Distributed Generator (DG) 100 in accordance with one or more embodiments of the present invention. The DG 100 comprises a plurality of photovoltaic (PV) modules 102A, 102B, and 102C (collectively referred to as PV modules 102), a plurality of DC/AC inverters 104A, 104B, and 104C (collectively referred to as inverters 104), a bus 106, a junction box 108, a controller 110, an alarm module 114, and an array frame 120. In one embodiment of the invention, each of the PV modules 102 is coupled to an individual inverter 104 (i.e., PV module 102A is coupled to inverter 104A, PV module 102B is coupled to inverter 104B, and PV module 102C is coupled to inverter 104C). In other embodiments, the PV modules 102 and inverters 104 may be coupled in different configurations, such as a plurality of PV modules 102 coupled to a single inverter 104, or a plurality of portions of PV modules 102 each coupled to an inverter 104. In other embodiments, the inverters 104 may be replaced by DC/DC converters and the bus 106 may carry DC energy to one or more of DC storage devices (e.g., batteries), DC-driven appliances, or a DC/AC inverter at the junction box 108 (e.g., a plurality of DC/DC boosters coupled to a centralized DC/AC inverter).

Each of the PV modules 102A, 102B, and 102C comprises a structural frame 112A, 112B, and 112C, respectively. The frames 112A, 112B, and 112C are collectively referred to as PV module frames 112. Each of the PV module frames 112 surrounds the perimeter of the corresponding PV module 102 and is coupled to the array frame 120. The PV module frames 112 and the array frame 120 are each constructed of any rigid conducting material, such as aluminum, or any combination of rigid conducting materials. The array frame 120 provides physical support for mounting the PV modules 102, for example, on a rooftop. In addition to being physically coupled to the array frame 120, the PV module frames 112 are also electrically coupled to the array frame 120 and the array frame 120 is coupled to ground (also referred to as protected earth, or PE) via a ground rod system of the DG for preventing any risk of electrical shock when coming in contact with the PV module frames 112.

In some embodiments, the bus 106 comprises a live conductor line L carrying a single phase of AC power, a neutral line N, and a ground line G. Each of the inverters 104 is coupled to lines L and N of the bus 106; in some embodiments the inverters 104 may additionally be coupled to ground line G of the bus 106. In one or more alternative embodiments, the bus 106 may comprise additional power lines and the inverters 104 may be coupled to one or more of such power lines (e.g., the inverters 104 may be coupled to a three-phase AC bus). A distal end of the bus 106 is coupled to a termination block 122 for terminating the bus 106, and a proximal end of the bus 106 is coupled to the junction box 108. A controller 110 for operably controlling the inverters 104 is coupled to the junction box 108, and the junction box 108 is additionally coupled to the commercial power grid.

The inverters 104 convert DC power generated by the PV modules 102 to AC power that is commercial power grid compliant and then couple the AC power to the junction box 108. The generated AC power may be further coupled from the junction box 108 to the one or more appliances and/or to the commercial power grid. Additionally or alternatively, generated energy may be stored for later use; for example, the generated energy may be stored utilizing batteries, heated water, hydro pumping, $H_2O$-to-hydrogen conversion, or the like.

In accordance with one or more embodiments of the present invention, the alarm module 114 is coupled to the DG 100 for indicating when a PV module 102 becomes disconnected from the DG 100 (e.g., stolen). The alarm module 114 is coupled to lines L, N, and G of the bus 106, thereby allowing the alarm module 114 to be continuously powered. When the inverters 104 are active and coupling power to the bus 106 (e.g., during daylight hours), the alarm module 114 receives power from the inverters 104; when the inverters 104 are inactive (e.g., during the night), the alarm module 114 receives power on the bus 106 from the commercial power grid.

The alarm module 114 is further coupled to each of the PV module frames 112 and couples a minimal monitoring current (e.g., on the order of 1 milliamp) to the PV module frames 112. The alarm module 114 monitors the flow of the monitoring current to the PV module frames 112. In the event that a PV module frame 112 becomes disconnected from the alarm module 114 (e.g., a PV module 102/PV module frame 112 is removed from the DG 100), the flow of monitoring current to the PV module frame 112 is interrupted. Additionally, in the event that either the ground connection of the array frame 120 or the bus 106 becomes disconnected, the monitoring current flow is interrupted. The alarm module 114 detects such a change in monitoring current flow and notifies the controller 110 to generate an alert regarding a disconnection within the DG 100. Such an alert indicates to a user that a PV module 102 has been disconnected and/or there is a potential ground disconnection safety issue.

The alarm module 114 may notify the controller 110 of the disconnection via wireless communication, power line communication (PLC), and/or any other wired or wireless type of communication. The controller 110 in turn generates the alert to indicate to a user that there is a disconnection; for example, the controller 110 may illuminate an LED, sound an audible alarm, generate an alarm message to a monitoring center, send an email to the PV module owner or to the authorities, or the like. In some alternative embodiments, the alarm module 114 may additionally or alternatively notify another element of the DG 100 (e.g., an inverter 104) about the disconnection, and/or generate the alert (e.g., illuminating an LED, sounding an audible alarm, generating an alarm message to a monitoring center, sending an email to the PV module owner or to the authorities, or the like).

In addition to actively providing a notification of a disconnection as described above, the alarm module 114 communicates a periodic heartbeat signal to the controller 110, for example, via a wired communication technique (such as PLC) and/or via a wireless communication technique. The heartbeat signal indicates that the alarm module 114 is operational and also provides a fail-safe means for indicating a PV module disconnection in the event that the alarm module 114 becomes damaged or disconnected from the DG 100 as well. When the alarm module 114 is damaged or disconnected, the heartbeat signal is no longer communicated to the controller 110. The absence of the heartbeat signal indicates to the controller 110 that the alarm module 114 may have been impacted due to one or more PV modules 102 being disconnected from the DG 100 or due to a ground disconnection occurrence and hence, an alert should be generated.

In some embodiments, the bus 106 is an AC wiring system such as the AC wiring system disclosed in the commonly assigned, co-pending U.S. patent application Ser. No. 12/931,081, entitled "Method and Apparatus for Interconnecting Distributed Power Sources" and filed Jan. 24, 2011, which is herein incorporated in its entirety by reference. In such embodiments, one or more alarm modules 114 are coupled to an AC bus (analogous to the AC bus 106) via suitable drop connectors and drop cables coupled to unused splice boxes of the wiring system.

In some alternative embodiments, the alarm module 114 may be coupled to fewer than all of the PV module frames 112; i.e., the alarm module 114 may be coupled to a subset of the PV module frames 112. In other alternative embodiments, the DG 100 may comprise a plurality of alarm modules 114 where each alarm module 114 is coupled to at least one PV module frame 112 (e.g., one alarm module 114 per PV module frame 112 or one alarm module 114 per two PV module frames 112) for monitoring the coupled PV module(s) 102. In still other alternative embodiments, the DG 100 may additionally or alternatively comprise components pertaining to other types of renewable energy generation, such as wind farms, hydroelectric systems, or the like. In such embodiments, one or more alarm modules 114 are coupled to one or more of such components for determining a disconnection as previously described.

Figure 2:
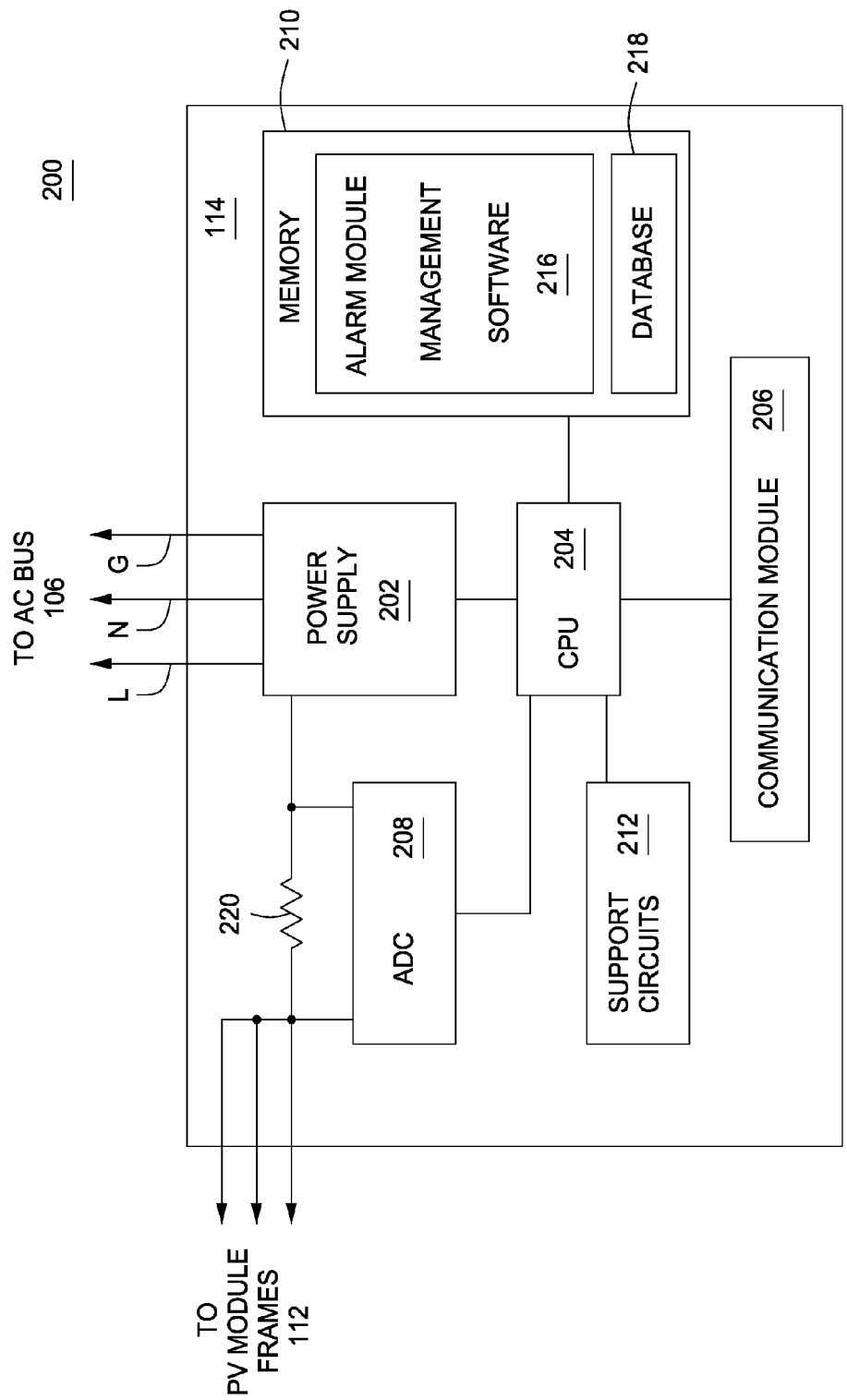
FIG. 2 is a block diagram of an alarm module in accordance with one or more embodiments of the present invention.

FIG. 2 is a block diagram of an alarm module 114 in accordance with one or more embodiments of the present invention. The alarm module 114 comprises a power supply 202, a communication module 206, an analog-to-digital converter (ADC) 208, memory 210, and support circuits 212, each coupled to a central processing unit (CPU) 204.

The CPU 204 may comprise one or more conventionally available microprocessors or microcontrollers. Alternatively, the CPU 204 may include one or more application specific integrated circuits (ASICs). The support circuits 212 are well known circuits used to promote functionality of the CPU 204. Such circuits include, but are not limited to, a cache, power supplies, clock circuits, buses, network cards, input/output (I/O) circuits, and the like. The alarm module 114 may be implemented using a general purpose processor that, when executing particular software, becomes a specific purpose processor for performing various embodiments of the present invention.

The memory 210 may comprise random access memory, read only memory, removable disk memory, flash memory, and various combinations of these types of memory. The memory 210 is sometimes referred to as main memory and may, in part, be used as cache memory or buffer memory. The memory 210 may store various forms of application software, such as the alarm module management software 216 for operating the alarm module 114 (e.g., generating the heartbeat signal, monitoring the current flow to the PV module frames 112, and the like). In alternative embodiments, the alarm module management software 216 may be implemented in hardware or a combination of hardware and software. The memory 210 may also comprise a database 218 for storing data related to the present invention.

The communication module 206 may utilize wired communication techniques (e.g., power line communication (PLC)) and/or wireless techniques for communicating with the controller 110. Additionally or alternatively, the communication module 206 may utilize one or more of such communication techniques for communicating with other elements of the DG 100 (e.g., the inverter 104) or outside of the DG 100 (e.g., to a central monitoring site).

The power supply 202 is coupled to the live conductor line L, the neutral line N, and the ground line G of the bus 106 for continually receiving power. When the inverters 104 are active and coupling power to the bus 106 (e.g., during daylight hours), the power supply 202 receives power from the inverters 104; when the inverters 104 are inactive (e.g., during the night), the power supply 202 receives power on the bus 106 from the commercial power grid. The power supply 202 powers the CPU 204 and also injects a monitoring current through a resistor 220 and onto the coupled PV module frames 112. Since the power line G is eventually connected to the installation ground rod system, the monitoring current can be injected through the installation wiring by referencing the power supply output to G. Generally the injected monitoring current is AC, although, in some embodiments, the injected monitoring current may be DC. The ADC 208 is coupled across the resistor 220 and provides samples representing the monitoring current to the CPU 204.

In the event that a PV module frame 112 becomes disconnected from the alarm module 114 (e.g., a PV module 102 is stolen from the DG 100) or if there is a ground disconnection, current flow to the PV module frame 112 is interrupted and the alarm module 114 detects the corresponding reduction in monitoring current through the resistor 220. In some alternative embodiments where separate monitoring currents are coupled to different PV module frames 112, the alarm module 114 may comprise additional resistors and ADCs for sampling the monitoring current coupled to each PV module frame 112 to determine when a PV module 102 has been disconnected.

Upon determining the change in monitoring current flow, the alarm module 114 notifies the controller 110 that a disconnection has occurred. The controller 110 then generates an alert (e.g., an illuminated LED, a siren, a tone, an alarm or alert to a monitoring center, an email to the owner of the PV module 102 or the authorities, or the like) to indicate to a user that there is a disconnection within the DG 100. Additionally or alternatively, the notification generated by the alarm module 114 may comprise one or more of such alerts.

Additionally, the alarm module 114 periodically (e.g., every minute) transmits a heartbeat signal to the control module 110 for indicating that the alarm module 114 is receiving power and operating normally. In the event that the alarm module 114 is damaged or disconnected from the DG 100 (e.g., if both the PV module 102 and the alarm module 114 are stolen), the heartbeat signal ceases and the controller 110 generates the alert indicating that the PV module 102 has been disconnected.

Figure 3:
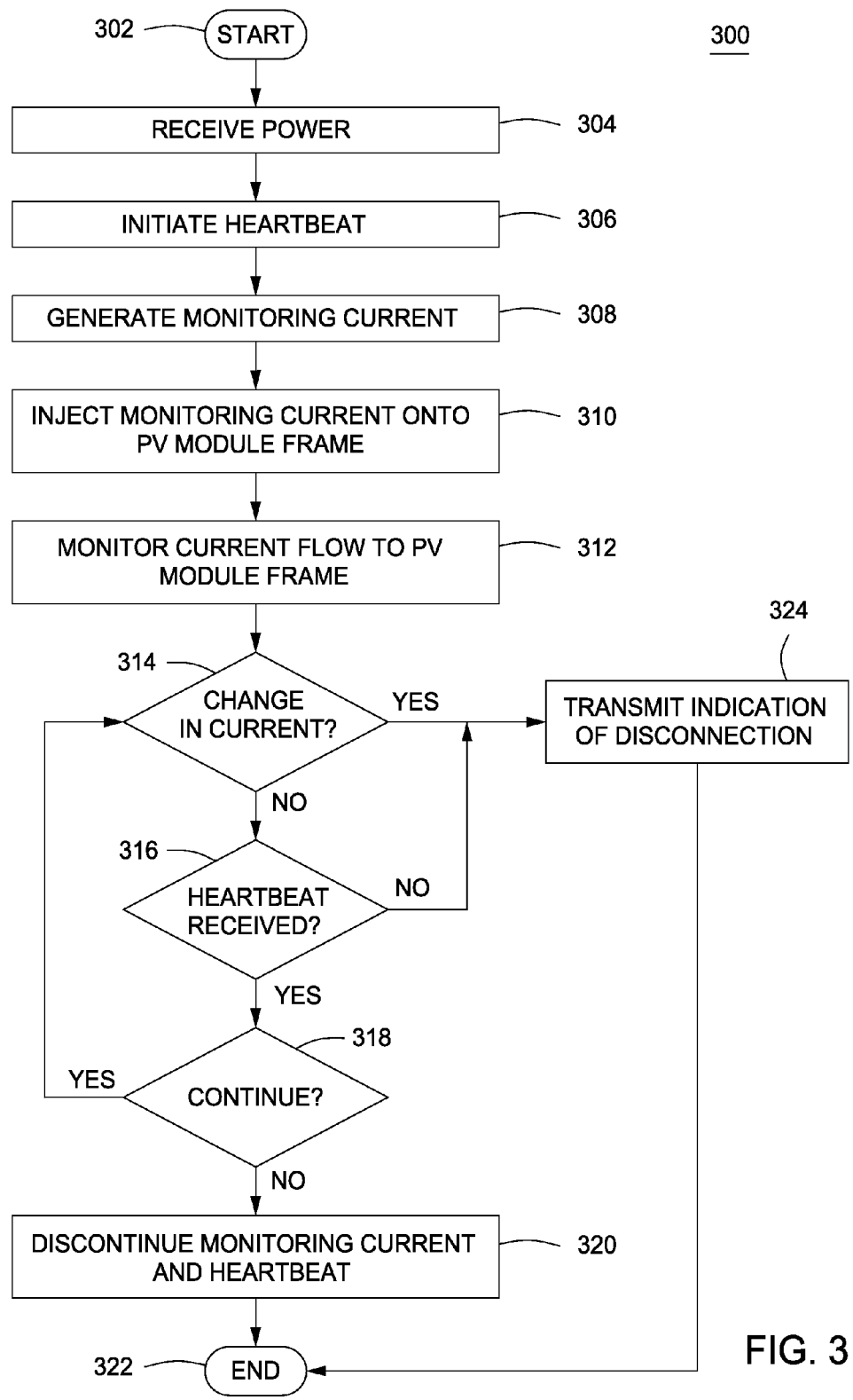
FIG. 3 is a flow diagram of a method for indicating a disconnection within a DG in accordance with one or more embodiments of the present invention.

FIG. 3 is a flow diagram of a method 300 for indicating a disconnection within a DG in accordance with one or more embodiments of the present invention. In some embodiments, such as the embodiment described below, the DG is a PV energy system comprising a plurality of PV modules that each has a conductive frame. The PV module frames are coupled to a conductive array frame that supports the PV modules (e.g., the PV modules may be mounted on the array frame on a rooftop). The array frame is additionally coupled to ground via a ground rod system of the DG for preventing an electrical shock hazard. Each PV module is coupled to a power converter, such as an inverter for inverting DC current from the PV module to AC current. In some alternative embodiments, the power converters may be DC/DC converters.

The power converters are coupled to a commercial power grid via a bus, and a controller is coupled to the bus for operably controlling the power converters. An alarm module (e.g., alarm module 114) is coupled to the bus, including a ground line of the bus, for receiving power from the power converters and/or the commercial power grid. The alarm module is also coupled to each PV module frame for detecting when a PV module is disconnected (e.g., if the PV module is stolen) or if the ground rod system becomes disconnected.

In some alternative embodiments, the alarm module may be coupled to a subset of the PV module frames rather than to each PV module frame; in other alternative embodiments, the PV energy system may comprise a plurality of alarm modules where each alarm module is coupled to at least one PV module frame (e.g., one alarm module per PV module frame) for monitoring the corresponding PV module(s). In other alternative embodiments, the DG may additionally or alternatively comprise components pertaining to other types of renewable energy generation, such as wind farms, hydroelectric systems, or the like. In such embodiments, one or more alarm modules are coupled to one or more of such components for determining a disconnection as described below.

The method 300 starts at step 302 and proceeds to step 304. At step 304, the alarm module receives power via the bus. In some embodiments, the alarm module is coupled to line, neutral, and ground wires of the bus for receiving a single phase of AC power; in other embodiments, the alarm module may be coupled to additional power lines (e.g., for receiving three-phase AC power). The alarm module is continuously powered via the bus. When the power converters are active and coupling power to the bus (e.g., during daylight hours), the alarm module receives power on the bus from the power converters; when the power converters are inactive (e.g., during the night), the alarm module receives power on the bus from the commercial power grid.

At step 306, the alarm module initiates a heartbeat signal and periodically (e.g., every minute) transmits the heartbeat signal to indicate that the alarm module is receiving power and operating normally. In some embodiments, the alarm module transmits the heartbeat signal to the controller utilizing wired (e.g., PLC) and/or wireless communication techniques.

The method 300 proceeds to step 308, where a monitoring current is generated. The monitoring current is generally AC on the order a 1 milliamp; alternatively, the monitoring current may be DC and/or at a different current level. At step 310, the monitoring current is injected onto (i.e., coupled to) the PV module frames.

The method 300 proceeds to step 312, where the flow of monitoring current to the PV module frames is monitored. In some embodiments, an analog-to-digital converter (ADC) may be utilized to obtain samples representative of the total monitoring current (i.e., the aggregate of the monitoring current coupled to each PV module frame). In other embodiments where separate monitoring currents are coupled to one or more PV module frames, a plurality of ADCs may be utilized for sampling each monitoring current coupled to the PV module frames (e.g., sampling each monitoring current coupled to each PV module). Based on samples of the monitoring current, a determination is made at step 314, whether there is a change in the flow of the monitoring current to the PV module frames. In some embodiments where an aggregate monitoring current is sampled, the change may be detected as a drop in current; in other embodiments where the alarm monitor samples the monitoring current coupled to a single PV module frame, the change may be detected as an interruption (i.e., discontinuance) of current flow.

If, at step 314, it is determined that there is a change in monitoring current flow, the method 300 proceeds to step 324. At step 324, a notification of the disconnection is communicated. In some embodiments, the alarm module notifies the controller and the controller then generates an alert (e.g., a visual or audible alarm such as an illuminated LED or a siren, a message to a monitoring center, an email to the owner of the PV module and/or the authorities, or the like) to indicate to a user that there is a disconnection within the DG. Additionally or alternatively, the notification generated by the alarm module may comprise such an alert. The method 300 then proceeds to step 322 where it ends.

If, at step 314, it is determined that there is no change in current flow, the method 300 proceeds to step 316. At step 316, a determination is made whether the heartbeat signal is being received. The heartbeat signal provides a fail-safe means for determining that a PV module has been disconnected from the DG in the event that the alarm module is damaged or disconnected as well. If, at step 316, it is determined that the heartbeat signal is no longer being received, the method 300 proceeds to step 324. If, at step 316, it is determined that the heartbeat signal is still being received, the method 300 proceeds to step 318.

At step 318, a determination is made whether to continue operation. If the result of such determination is yes, the method 300 returns to step 314; if the result of such determination is no, the method 300 proceeds to step 320. At step 320, the monitoring current and the heartbeat are discontinued, and the method 300 proceeds to step 322 where it ends.

The foregoing description of embodiments of the invention comprises a number of elements, devices, circuits and/or assemblies that perform various functions as described. These elements, devices, circuits, and/or assemblies are exemplary implementations of means for performing their respectively described functions.

While the foregoing is directed to embodiments of the present invention, other and further embodiments of the invention may be devised without departing from the basic scope thereof, and the scope thereof is determined by the claims that follow.

The invention claimed is:

1. Apparatus for indicating a disconnection within a Distributed Generator (DG), comprising:
    an alarm module electrically coupled to a conductive frame of a component within the DG, wherein the conductive frame is grounded via a ground rod system, and wherein the alarm module (i) is further coupled to a ground line, (ii) couples a monitoring current to the conductive frame, (iii) monitors flow of the monitoring current to determine a change in the flow, and (iv) generates, as a result of the change in the flow, a notification of the disconnection.

2. The apparatus of claim 1, wherein the alarm module communicates the notification to a controller of the DG.

3. The apparatus of claim 2, wherein the alarm module communicates a periodic heartbeat signal to the controller, and wherein the controller generates an alert upon at least one of receiving the notification or cessation of the heartbeat signal.

4. The apparatus of claim 1, wherein the notification indicates at least one of (a) the component is physically disconnected from the DG or (b) a potential ground disconnection safety issue.

5. The apparatus of claim 1, wherein the alarm module is continuously powered by at least one of the DG or a commercial power grid.

6. The apparatus of claim 1, wherein the monitoring current is on the order of 1.0 milliamp.

7. The apparatus of claim 1, wherein the component is a photovoltaic module.

8. A method for indicating a disconnection within a Distributed Generator (DG), comprising:
    coupling a monitoring current to a conductive frame of a component within the DG, wherein the conductive frame is grounded via a ground rod system;
    monitoring flow of the monitoring current to determine a change in the flow; and
    generating, as a result of the change in the flow, a notification of the disconnection.

9. The method of claim 8, further comprising communicating the notification to a controller of the DG.

10. The method of claim 8, further comprising communicating a periodic heartbeat signal and generating, upon cessation of the heartbeat signal, an alert.

11. The method of claim 8, wherein the notification indicates at least one of (a) the component is physically disconnected from the DG or (b) a potential ground disconnection safety issue.

12. The method of claim 8, further comprising continuously powering the alarm module by at least one of the DG or a commercial power grid.

13. The method of claim 8, wherein the monitoring current is on the order of 1.0 milliamp.

14. The method of claim 8, wherein the component is a photovoltaic module.

15. A system for indicating a disconnection within a Distributed Generator (DG), comprising:
    a photovoltaic (PV) module comprising a conductive frame, wherein the conductive frame is grounded via a ground rod system; and
    an alarm module, wherein the alarm module (i) is electrically coupled to the conductive frame and to a ground line, (ii) couples a monitoring current to the conductive frame, (iii) monitors flow of the monitoring current to determine a change in the flow, and (iv) generates, as a result of the change in the flow, a notification of the disconnection.

16. The system of claim 15, further comprising a controller communicatively coupled to the alarm module, wherein the alarm module communicates the notification to the controller.

17. The system of claim 16, wherein the alarm module communicates a periodic heartbeat signal to the controller, and wherein the controller generates an alert upon at least one of receiving the notification or cessation of the heartbeat signal.

18. The system of claim 15, wherein the notification indicates at least one of (a) the PV module is physically disconnected from the DG or (b) a potential ground disconnection safety issue.

19. The system of claim 15, wherein the alarm module is continuously powered by at least one of the DG or a commercial power grid.

20. The system of claim 15, wherein the monitoring current is on the order of 1.0 milliamp.

* * * * *